United States Patent [19]

Mise

[11] Patent Number: 5,068,711
[45] Date of Patent: Nov. 26, 1991

[54] SEMICONDUCTOR DEVICE HAVING A PLANARIZED SURFACE

[75] Inventor: Tatsuya Mise, Kawasaki, Japan

[73] Assignee: Fujitsu Limited, Kawasaki, Japan

[21] Appl. No.: 495,514

[22] Filed: Mar. 19, 1990

[30] Foreign Application Priority Data

Mar. 20, 1989 [JP] Japan .................................. 1-68656

[51] Int. Cl.$^5$ ...................... H01L 21/94; H01L 21/95
[52] U.S. Cl. ......................................... 357/71; 357/54
[58] Field of Search ...................... 357/54, 71, 47, 49

[56] References Cited

U.S. PATENT DOCUMENTS

| | | | |
|---|---|---|---|
| 4,485,393 | 11/1984 | Kumamaru et al. | 357/54 |
| 4,621,277 | 11/1986 | Ito et al. | 357/54 |
| 4,733,289 | 3/1988 | Tsurumaru | 357/71 |
| 4,879,257 | 11/1989 | Patrick | 357/71 |

FOREIGN PATENT DOCUMENTS

WO87/07979 6/1987 PCT Int'l Appl. .

OTHER PUBLICATIONS

"Refractory Contact Stud", IBM Technical Disclosure, vol, 29, No. 11, Apr. 1987, pp. 5091-5092.
Planarization Process Using Spin-On-Glass, G. H. Ting et al., IEEE VLSI Multilevel Interconnection Conference, Jun. 1987.

Primary Examiner—Rolf Hille
Assistant Examiner—S. V. Clark
Attorney, Agent, or Firm—Armstrong, Nikaido, Marmelstein, Kubovcik & Murray

[57] ABSTRACT

A semiconductor device having a multi-level interconnection structure includes an active device, a substrate supporting the active device thereon, and a first insulator layer provided so as to cover the substrate including the active device. A first conductor pattern is provided on the first insulator layer. A planarizing layer has a planarized top surface provided on the first insulator layer so as to bury the first conductor pattern underneath. A second insulator layer is provided on the planarized top surface of the planarizing layer. A contact hole is provided on the second insulator layer so as to expose a desired part of the first conductor pattern. A second conductor pattern is provided on the second insulator layer in correspondence to the contact hole so as to fill the contact hole and so as to make a contact to the exposed part of the first conductor pattern. An isolated region is provided on the substrate in correspondence to a part of the substrate underneath the contact hole such that the isolated region is projected from the first top surface of the substrate in correspondence to the contact hole. The isolated region causes a projection of the top surface of the first insulator layer in correspondence to a part which covers the isolated region such that the planarizing layer provided on the first insulator layer is eliminated from the part of the first insulator having the projecting top surface.

7 Claims, 9 Drawing Sheets

PRIOR ART

PRIOR ART

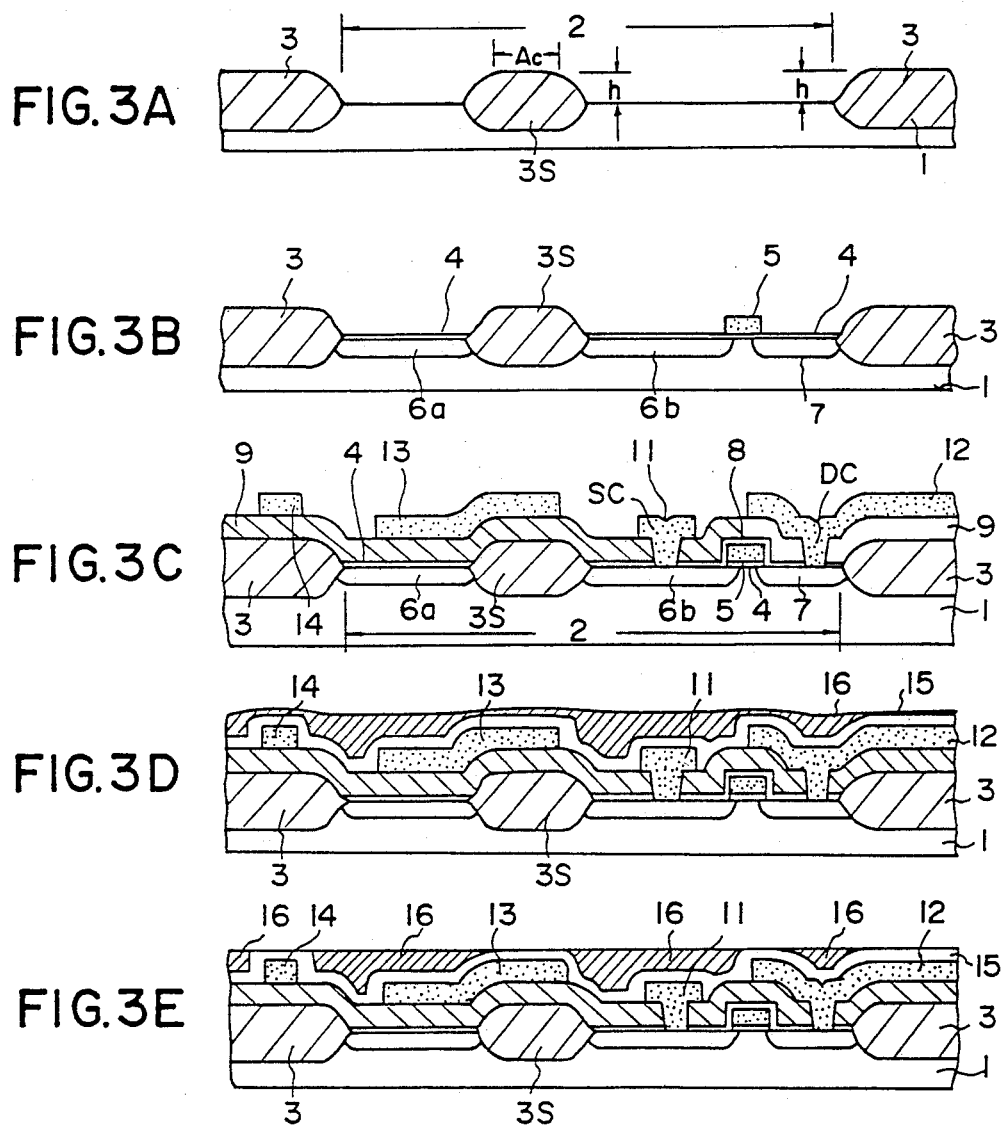

SEMICONDUCTOR DEVICE HAVING A PLANARIZED SURFACE

BACKGROUND OF THE INVENTION

The present invention generally relates to fabrication of semiconductor devices, and more particularly to an improved method for fabricating a semiconductor device having a multi-level interconnection structure.

In modern semiconductor integrated circuits having a high integration density, the multi-level interconnection structure is used commonly for interconnection of various devices within the integrated circuit.

In such semiconductor integrated circuits having the multi-level interconnection structure, it is essential that the device has a planarized top surface so that the conductor pattern provided thereon for forming the interconnection is provided with high precision and with excellent contact to the top surface. When the top surface is not sufficiently planarized, defective interconnection tends to occur and the yield as well as the reliability of the integrated circuit is decreased.

In order to planarize the top surface of semiconductor integrated circuits, a so-called spin-on-glass (SOG) technique is used commonly, wherein the top surface of the integrated circuit on which various interconnections are to be provided, is coated by a solution of organic silicon oxide dissolved into an organic solvent. Such a solution has an extremely low viscosity, and upon evaporation of the solvents, provides an insulating silicon oxide layer called an SOG layer which has a substantially flat top surface suitable for providing the multi-level interconnection structure thereon. However, such a SOG layer has a problem in that, because of the continuous release of organic gases and water even after solidification, defective contacts tend to occur particularly in the contact holes which are provided through the SOG layer in order to achieve an interconnection between metal electrodes such as aluminum deposited thereon and the semiconductor devices buried thereunder.

FIGS. 1A–1G show a conventional process of planarizing the top surface of an integrated circuit by an SOG process. In this example, the integrated circuit includes a MOSFET device as an active device.

Referring to FIG. 1A, a field oxide region 53 for the device isolation is formed on a silicon substrate 51 by the usual selective oxidization of the silicon substrate 51 such that the field oxide region 53 defines a device region 52 in which the MOSFET device is to be formed.

Next, in a step of FIG. 1B, a gate oxide film 54 is provided on the device region 52, and the formation of the polysilicon gate electrode 55 as well as the formation of the source and drain regions 56 and 57, are performed according to the usual MOS process.

In a step of FIG. 1C, the gate oxide film 54 is removed except for the region under the polysilicon gate electrode 55, and the entire structure is covered by a thin oxide film 58 for preventing contamination by impurities. A first insulator layer 59 of phosphosilicate glass (PSG) and the like is provided on the entire top surface, and contact holes 60 are provided through the first insulator layer 59. A first conductor layer (not shown) of aluminum and the like is provided on the first insulator layer 59 so as to make a contact to the underlying semiconductor device through the contact holes 60. The first conductor layer is patterned to form: a source electrode 61 connected to the source region 56; a drain electrode 62 connected to the drain region 57; a first aluminum pattern 63 remaining on the first insulator layer 59 in correspondence to the source region 56; a second aluminum pattern 64 remaining on the first insulator layer 59 in correspondence to the field oxide region 53, and the like.

In a step of FIG. 1D, a thin silicon oxide film 65 is provided so as to cover the aluminum electrodes and patterns 61–64 as well as the first insulator layer 59, by a chemical vapor deposition (CVD) process, and on this silicon oxide film 65, an SOG layer 66 is provided in a form of organic solution. This SOG layer 66 is solidified by curing performed at 400°–450° C.

In a step of FIG. 1E, the SOG layer 66 is subjected to a plasma etching process using a methyl trifluoride (CHF3) gas, whereby the top surface of the SOG layer 66 is planarized as a result of selective removal of the projections from the layer 66 while leaving the depressions unetched.

Next, in a step of FIG. 1F, a second PSG layer 67 is provided by the CVD process, and a contact hole 68 for inter-layer connection is provided through the PSG layer 67 and the SOG layer 66, and further through the silicon oxide layer 65 so as to expose the aluminum conductor 63 on the first PSG layer 59. Note that, at the side wall of the contact hole 68 thus provided, the SOG layer 66 is exposed.

Finally, in a step of FIG. 1G, an aluminum layer is provided on the second PSG layer 67 including the contact hole 68, and after suitable patterning, an aluminum electrode 69 contacting to the aluminum conductor 63 is obtained. The structure thus obtained may be covered further by an insulator layer not illustrated.

In the foregoing multi-level interconnection structure, it should be noted that the SOG layer 66 is exposed at the side wall of the interlayer contact hole 68. This means that the aluminum electrode 69 makes a direct contact to the SOG layer 66 at the side wall of the contact hole 68. The deposition of the aluminum layer forming the electrode 69 is made by sputtering performed under a vacuum environment. A pressure of $10^{-3}$ Torr is used commonly for this purpose. Under such a high vacuum environment, there is a tendency that small amounts of water vapor or gases of organic molecules are continuously released from the SOG layer 66, even after the curing of the SOG layer 66. When water or organic molecules are released, the particle of aluminum deposited in the contact hole 68 becomes excessively coarse as schematically illustrated in FIG. 1G by a numeral 69G, and there is a substantial risk that the contact resistance is increased or the electric contact fails at such a region.

A same problem occurs also when the contact hole 68 is provided at a region of the device where the top surface of the layer underlying the SOG layer 66 is depressed as shown in FIG. 2. In this example, the aluminum conductor 66 is depressed between a pair of gate electrodes 55a and 55b. The existence of such a depressed region on the surface inevitably invites collection of the SOG layer and thus, the SOG layer 66 is exposed at the side wall of the contact hole 68 when the contact hole is provided in correspondence to such a depressed region. As already noted, such an exposure of the SOG layer 66 causes release of gases when the electrode 69 is sputtered, and the problem of unreliable electric contact similarly occurs.

SUMMARY OF THE INVENTION

Accordingly, it is a general object of the present invention to provide a novel and useful semiconductor device wherein the foregoing problems are eliminated.

Another object of the present invention is to provide a semiconductor device having a planarized surface, wherein a region of the semiconductor device in which a contact hole is to be provided, is formed to have an increased level with respect to the rest of the regions such that, when an SOG layer is provided on the semiconductor device for surface planarization, the region of the device where the contact hole is to be provided becomes substantially flush to or projected above the level of the SOG layer. According to the present invention, an excellent surface planarization of the semiconductor device is achieved and at the same time, the problems such as the SOG layer exposed at the side wall of the contact holes are eliminated. Thus, the release of gases at the time of filling the contact hole by the metal electrode is avoided, and a reliable semiconductor integrated circuit having a reliable contact at the inter-layer contact holes is obtained.

Other objects and further feature of the present invention will become apparent from the following detailed description when read in conjunction with the attached drawings.

BRIEF DESCRIPTION OF THE DRAWINGS

FIGS. 3A-3G are cross-sectional views showing various steps for providing a multi-level interconnection structure on a semiconductor device according to a first embodiment of the present invention;

DETAILED DESCRIPTION

Figure 1A:
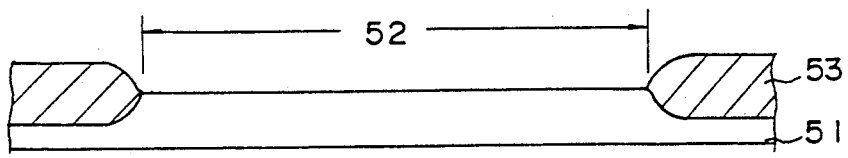
FIGS. 1A-1G are cross-sectional views showing various steps for providing a conventional multi-level interconnection structure on a semiconductor device.
Figure 1B:
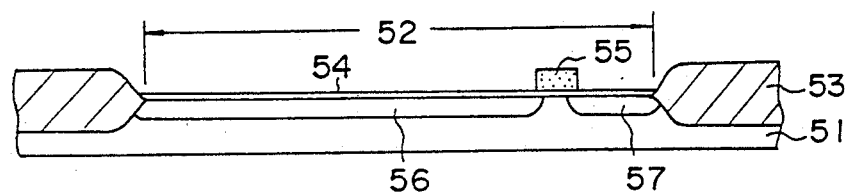
Figure 1C:
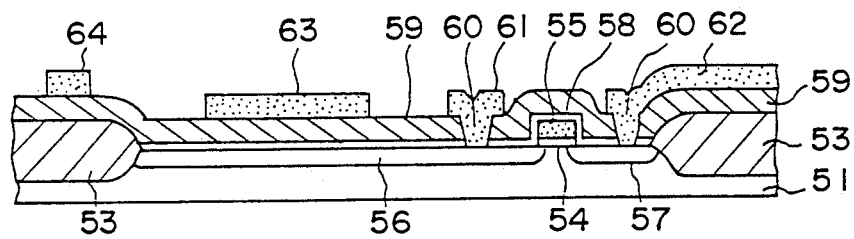
Figure 1D:
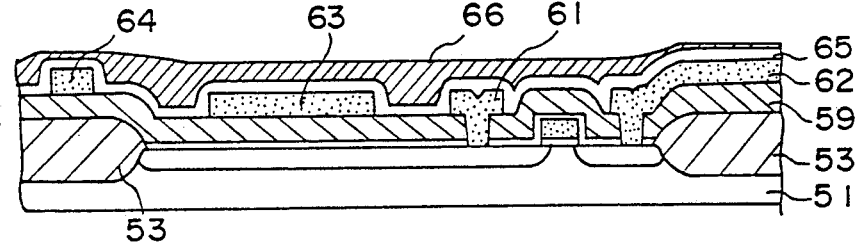
Figure 1E:
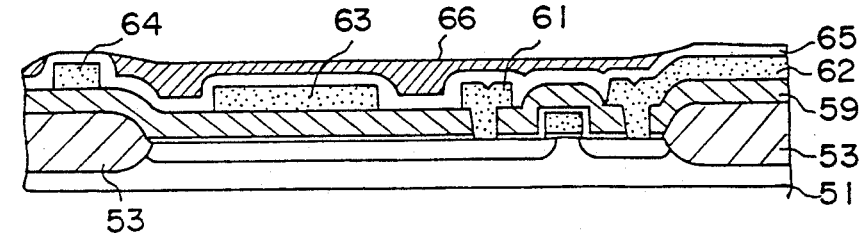
Figure 1F:
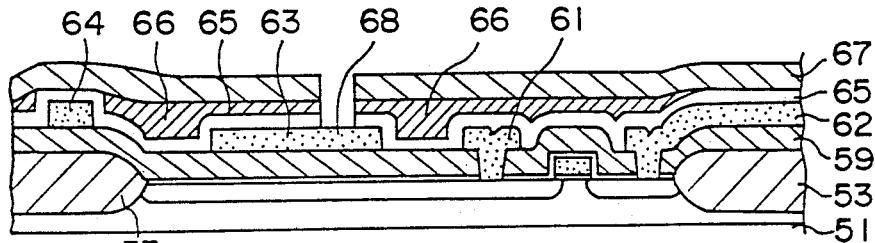
Figure 1G:
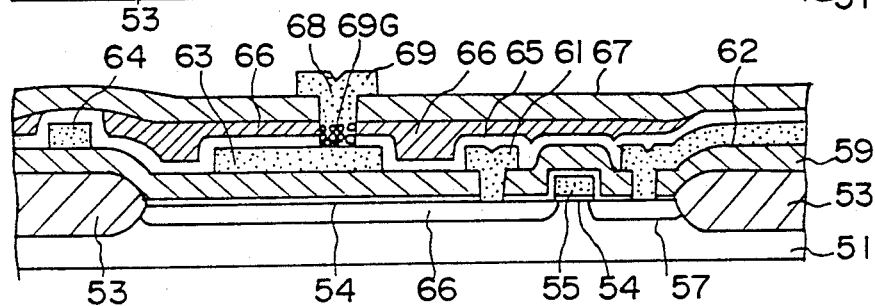
Figure 2:
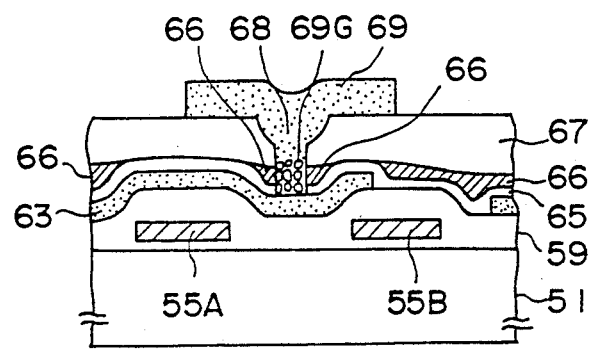
FIG. 2 is a cross-sectional view showing another conventional multi-level interconnection structure.

Hereinafter, the present invention will be described.

FIGS. 3A-3G show various steps of providing the multi-level interconnection structure according to a first embodiment of the present invention.

Referring to FIG. 3A, a silicon substrate 1 is subjected to a local oxidation (LOCOS) using a oxidation resistant mask not illustrated. As a result of the oxidation, a field oxide region 3 defining a device region 2 is formed for a thickness of about 6000-8000 Å. The field oxide region 3 thus formed projects upwards from the surface of the silicon substrate 1 for a height $h_1$ which is typically 3000-4000 Å. At the same time to the formation of the field oxide region 3, an isolated region or island-like region 3s is formed in the device region 2 in correspondence to a region Ac where a contact hole for inter-layer connection is to be formed, with a same height as the height $h_1$.

In a step of FIG. 3B, a gate oxide film 4 is formed on the exposed surface of the silicon substrate 1 in correspondence to the device region 2 for a thickness of about 200 Å. Further, a polysilicon layer not illustrated is deposited on the gate oxide film 4 for a thickness of about 4000 Å by the CVD process. Next, the polysilicon layer is patterned to form a polysilicon gate electrode 5, and ion implantation of arsenic ($As^+$) into the substrate 1 is performed through the gate oxide film 4, using the field oxide region 3, 1 island-like region 3s, and the gate electrode 5 as the mask As a result of the ion implantation, a source region 6a and 6b as well as a drain region 7, all of the $n^+$-type, are formed in the substrate 1 as illustrated. It should be noted that the source region 6a and the source region 6b are continued each other at the level different from the level of the sheet of the drawing.

In a step of FIG. 3C, the gate oxide film 4 is removed except for the part underlying the polysilicon gate electrode 5 by etching, and an oxide film 8 for eliminating contaminations by impurities is provided on the entire surface of the structure thus obtained by thermal oxidation. Further, an insulator layer 9 of PSG is provided on the oxide film 8 for a thickness of about 5000-6000 Å by the CVD process, and contact holes SC and DC are formed so as to penetrate through the insulator layer 9 and further through the oxide film 8 respectively in correspondence to the source region 6b and the drain region 7. Next, a first conductor layer (not illustrated) comprising pure aluminum or aluminum alloy containing silicon is deposited by sputtering on and DC for a thickness of about 6000-8000 Å, and after suitable patterning, a source electrode 11 connected to the source region 6b and a drain electrode 12 connected to the drain region 7 are formed as the part of the foregoing first conductor layer remaining after the patterning. It should be noted that the first conductor layer fills the contact holes SC and DC completely at the time of deposition and thus, the source electrode 11 and the drain electrode 12 make a reliable contact to the underlying source region 6b and the drain region 7 through these contact holes SC and DC. The drain electrode 12 extends on the PSG layer 9 in correspondence to the field oxide region 3 as illustrated. Further, as a result of the patterning of the first conductor layer, a first layer conductor pattern 13 is formed on the PSG layer 9 so as to extend from the source region 6a to the island-like region 3s. Furthermore, and another first layer pattern 14 is formed on the PSG layer 9 in correspondence to the field oxide region 3 as a result of the patterning.

In a step of FIG. 3D, a silicon oxide film 15 is deposited on the entire surface of the device thus obtained for a thickness of about 1000-2000 Å by the CVD process. Further, a solution of SOG is applied on the silicon oxide film 15 by the spin-coating using a revolution of about 3000 r.p.m. The SOG thus coated is then solidified by evaporating the solvent at a temperature of 400°-500° C. As a result, an SOG layer 16 is formed. FIG. 3D shows the SOG layer 16 as formed.

Next, in a step of FIG. 3E, the SOG layer 16 is uniformly etched by applying a dry etching process using $CHF_3$ as the reactive species, until the silicon oxide film 15 is exposed in correspondence to the projected parts such as the part covering the drain electrode 12 on the field oxide region 3 or the part covering the first layer pattern 13 on the island-like oxide region 3s. As a result of this etching process, the top surface of the SOG layer 16 is substantially planarized.

Figure 3F:
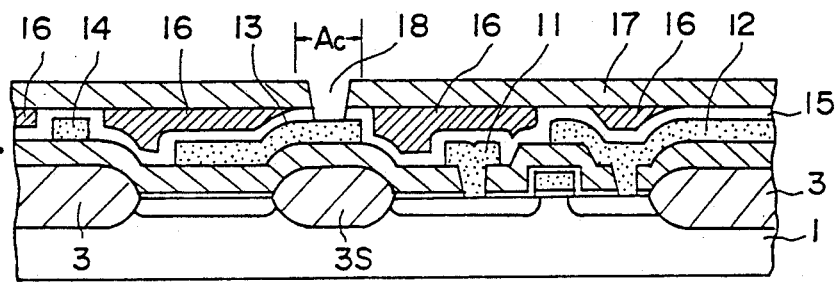
Figure 3G:
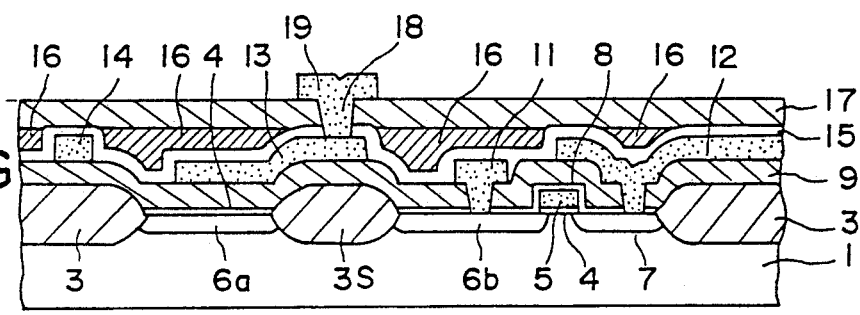

In a step of FIG. 3F, a second PSG layer 17 is provided on the planarized SOG layer 16 for a thickness of 6000–8000 Å by the CVD process, and a contact hole 18 is formed in correspondence to a region A where the contact hole is to be formed such that the contact hole 18 penetrates through the PSG layer 17 and further through the silicon oxide film 15 underneath, until the first layer conductor pattern 13 is exposed. It should be noted that the SOG layer 16 provided on the silicon oxide film 15 is completely removed from the region Ac by the previous dry etching process, and therefore, the SOG layer 16 is no longer exposed at the side wall of the contact hole 18.

Next, a second conductor layer of pure aluminum or aluminum alloy containing silicon, is deposited on the PSG layer 17 including the contact hole 18 by sputtering for a thickness of about 1 $\mu$m. Thereby, the second conductor layer fills the contact hole 18 completely. After the deposition, the second conductor layer is patterned and a second layer conductor pattern 19 is formed.

In the contact hole 18 thus formed, the SOG layer 17 is no longer exposed at the side wall, and the problem such as the water vapor or organic gases released when filling the contact hole 18 by sputtering of aluminum, is avoided. Thus, the second layer conductor pattern 19 has a uniform texture of fine aluminum grains and a reliable electric contact is achieved between the second layer conductor pattern 19 and the first layer conductor pattern 13.

After the formation of the first layer conductor pattern 13, an insulator layer (not shown) is provided on the entire surface of the device thus formed, and thereby the fabrication of the MOS device is completed.

Next, a second embodiment of the present invention will be described with reference to FIGS. 4A–4F. In this embodiment, a projecting region is provided so as to surround the region where the contact hole is to be provided, prior to the spin-coating of the SOG layer.

Figure 4A:
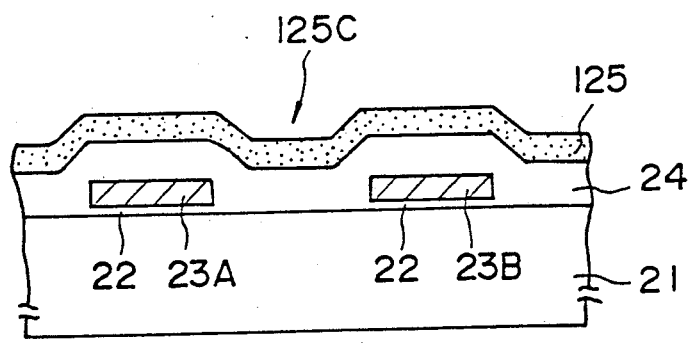
FIGS. 4A-4F are cross-sectional views showing various steps for providing a multi-level interconnection structure on a semiconductor device according to a second embodiment of the present invention.

Referring to the step of FIG. 4A, a silicon substrate 21 is subjected to a thermal oxidation process to form a gate oxide film 22. Further, gate electrodes 23a, 23b of polysilicon are provided on the gate oxide film 22 such that the gate electrodes extend parallel to each other. Further, ion implantation is performed using these gate electrodes 23a and 23b, and thereby the substrate 21 as usual. Further, an insulator layer 24 is provided such that the gate electrodes 23a and 23b are embedded therein, and a first conductor layer 125 comprising aluminum or aluminum alloy is provided on the layer 24 by sputtering such that the first conductor layer 125 covers the region of the layer 24 located above the gate electrodes 23a and 23b. It should be noted that the first conductor layer 125 has a surface which is undulated in accordance to the surface profile of the insulator layer 24, and thus, there is formed a depressed region 125C in correspondence to the depression formed in the layer 24 between the gate electrode 23a and the gate electrode 23b.

Figure 4B:
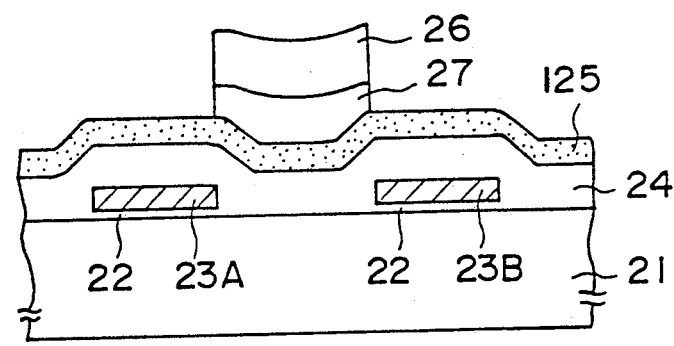

In a step of FIG. 4B, a silicon oxide layer (not shown) is provided uniformly to cover the first conductor layer 125 by the CVD process, and after provision of a photoresist 26 and the patterning thereof, which leaves the photoresist 26 in correspondence to the depressed region 125c, the silicon oxide layer is patterned using the patterned photoresist 26 as the mask and thereby a silicon oxide region 27 is 20 formed in correspondence to the depressed region 125c as illustrated.

Figure 4C:
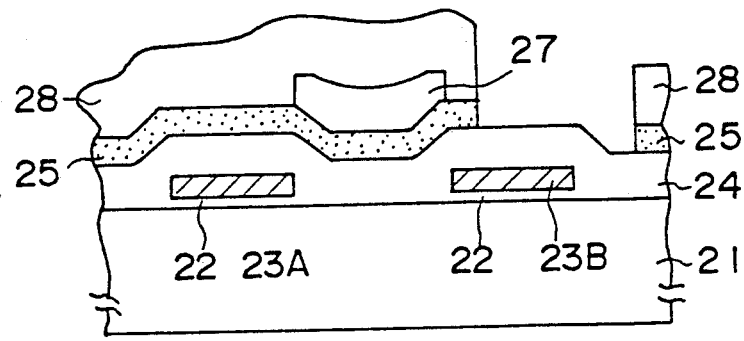

Next, in a step of FIG. 4C, another photoresist 28 is provided uniformly on the structure of FIG. 4B and patterned subsequently to form a mask used for patterning of the underlying first conductor layer 125. Further, by performing the patterning of the first conductor layer 125 using the patterned photoresist 28 as the mask, a first layer conductor pattern 25 is formed as illustrated in FIG. 4C.

Figure 4D:
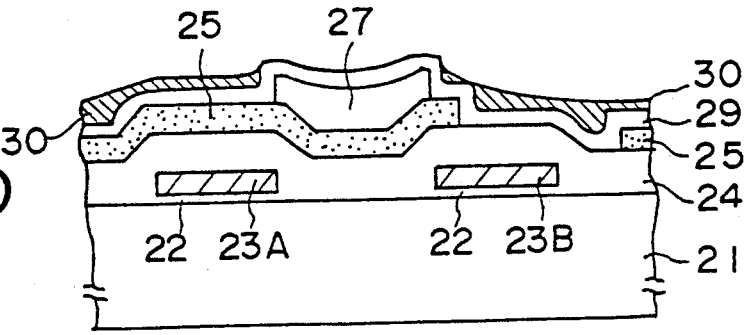

Next, in a step of FIG. 4D, the photoresist 28 is removed, and a silicon oxide film 29 is deposited uniformly over the entire surface of the structure thus formed, by the CVD process. This silicon oxide film 29 acts to smooth the projections formed on the surface of the first layer conductor pattern 25. Next, an SOG process is applied on the entire surface of the device thus obtained such that an SOG layer 30 is formed by the spin-coating. Thereby, the SOG layer 30 is formed such that the layer 30 fills every depressions on the surface of the device thus formed. Note that the silicon oxide region 27 provided on the depressed region 125c is projected and thus, the silicon oxide region 27 is substantially free from coverage by the SOG layer 30. After the spin-coating, the SOG layer 30 is solidified by annealing for evaporating the solvents. An etching process may be further applied to the entire surface of the structure thus obtained so as to make sure that no SOG layer 30 is remained on the silicon oxide region 27.

Figure 4E:
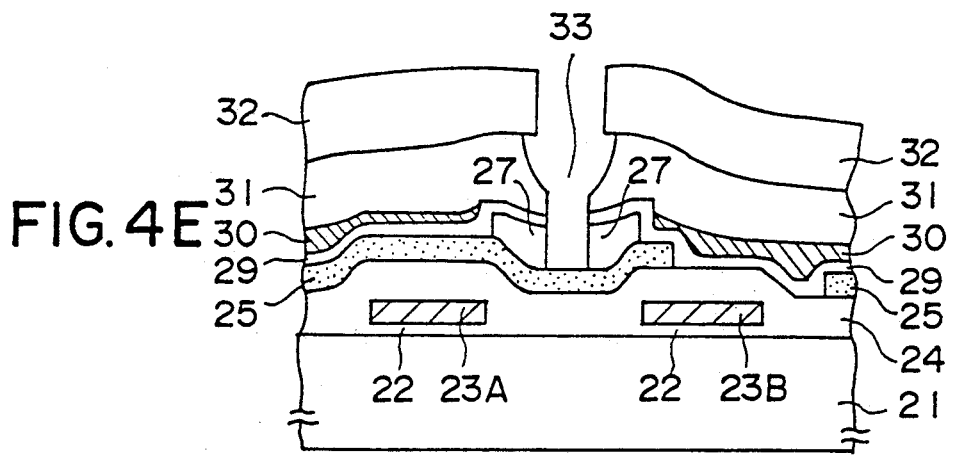

Next, in a step of FIG. 4E, a PSG layer 31 is provided on the entire surface of the device obtained by the foregoing process, and a photoresist 32 is provided on the PSG layer 31. After patterning the photoresist 32, a contact hole 33 is provided, penetrating through the PSG layer 31 and further through the silicon oxide layers 29 and 27 underneath, until the top surface of the first layer conductor pattern 25 is exposed.

Figure 4F:
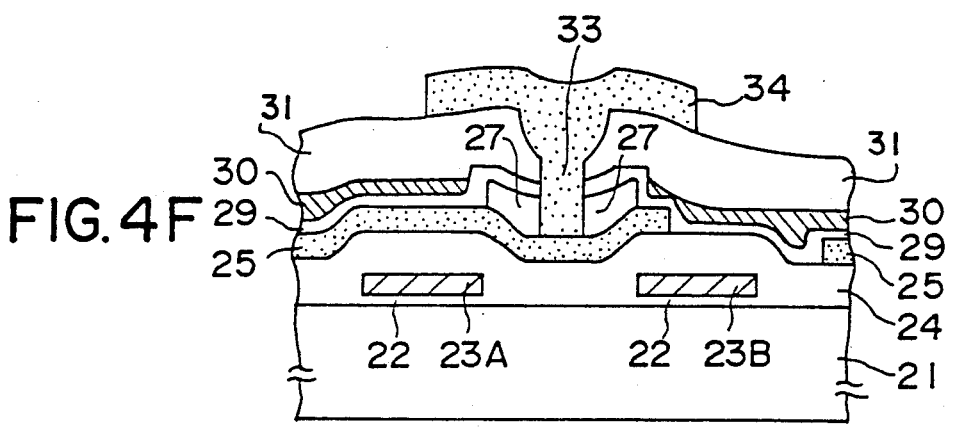

Next, in a step of FIG. 4F, a second conductor layer not illustrated is deposited on the entire surface of the structure thus obtained by sputtering including the contact hole 33, and a second layer conductor pattern 34 is formed after patterning of the second conductor layer such that the second layer conductor pattern 34 is connected to the first layer conductor pattern 25 through the contact hole 33. As the SOG layer 30 is not existing in the region where the contact hole 33 is provided, no SOG layer 30 is exposed at the side wall of the contact hole 33, and as a result, the problem of unreliable electric contact at the contact hole 33 because of the enlarged grain size of aluminum forming the second layer conductor pattern 34, is avoided.

Figure 5:
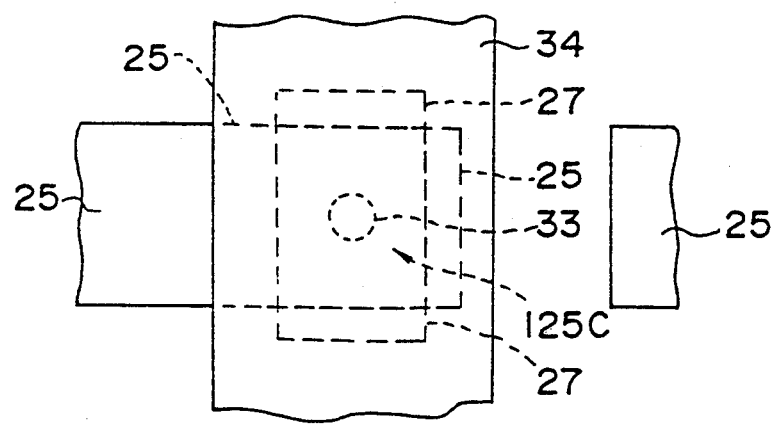
FIG. 5 is a diagram showing the multi-level interconnection structure of the second embodiment in a plan view.

FIG. 5 shows a plan view of the semiconductor device fabricated according to the second embodiment. It will be seen that the first layer conductor pattern 25 is connected to the second layer conductor pattern crossing thereto at the contact hole 33 provided in the silicon oxide pattern 27 in correspondence to the depressed region 125c.

Next, a third embodiment of the present invention will be described with reference to FIGS. 6A–6H for a case where deposition of polysilicon is made in correspondence to a depressed region in which a contact hole is to be formed. This embodiment is useful when a polysilicon layer is used extensively in the semiconductor device for interconnections and resistances. In the drawing, the parts corresponding to those already described are given identical reference numerals and the description thereof will be omitted.

Figure 6A:
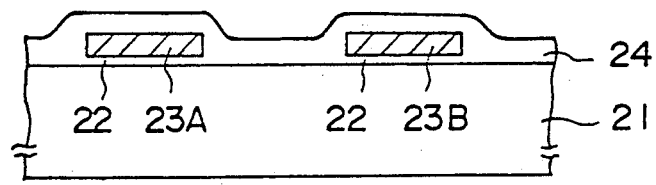
FIGS. 6A-6H are cross-sectional views showing various steps for providing a multi-level interconnection structure on a semiconductor device according to a third embodiment of the present invention.

Referring to FIG. 6A, a structure is formed similarly to the foregoing second embodiment wherein the polysilicon gate electrodes 23a and 23b are provided on the gate oxide film 22 which in turn is provided on the silicon substrate 21. Further, the source and drain regions (not illustrated) are formed in the substrate 21 as usual. Further, the entire structure is covered by the insulator layer 24.

Figure 6B:
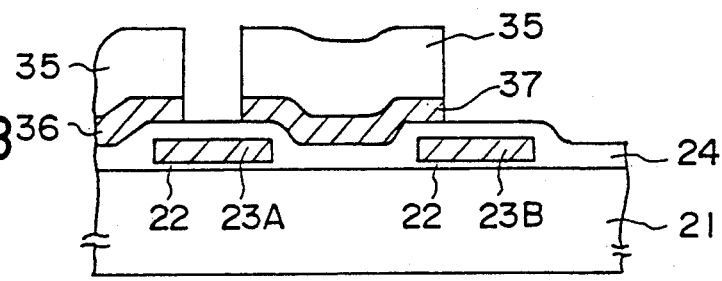

In a step of FIG. 6B, polysilicon is deposited on the insulator layer 24, and after patterning using a photoresist 35, a polysilicon pattern 36 which is used for resistances and interconnection patterns is formed. Further, another isolated polysilicon region 37 is formed on the insulator layer 24 in correspondence to a depression between the gate electrodes 23a and 23b where a contact hole is to be provided. It should be noted that the polysilicon region 37 does not extend extensively on the insulator layer 24 but the extension of the polysilicon region 37 is limited to such a depressed region in which the contact hole is to be provided. Note that the formation of the polysilicon region 37 is made simultaneously to the formation of polysilicon pattern 36 used for resistances or interconnection conductors, and thus the provision of the polysilicon region 37 does not increase the number of steps needed to fabricate the semiconductor device.

Figure 6C:
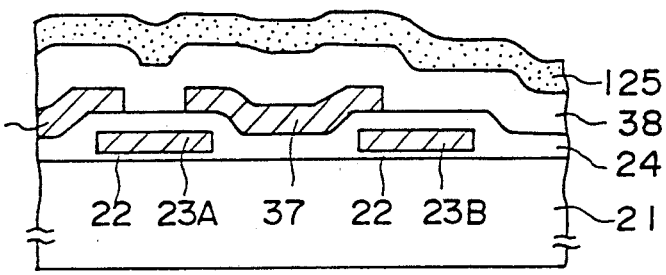

In a step of FIG. 6C, an inter-layer insulation layer 38 is provided on the entire structure after removing the photoresist 35, and the first conductor layer 125 of aluminum is provided on the entire surface of the insulation layer 38.

Figure 6D:
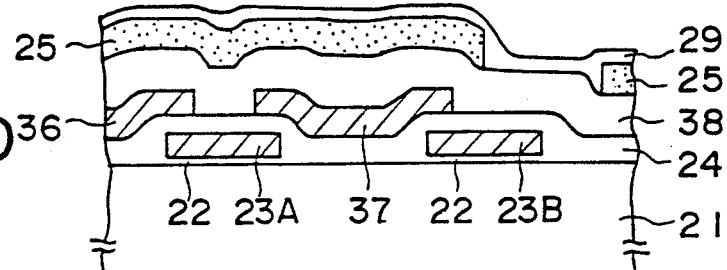

In a step of FIG. 6D, the first conductor layer 125 is patterned using a patterned photoresist not illustrated, and whereby the first layer conductor pattern 25 is formed. Further, the silicon oxide layer 29 is formed so as to cover the entire surface of the device thus formed as illustrated in FIG. 6D.

Figure 6E:
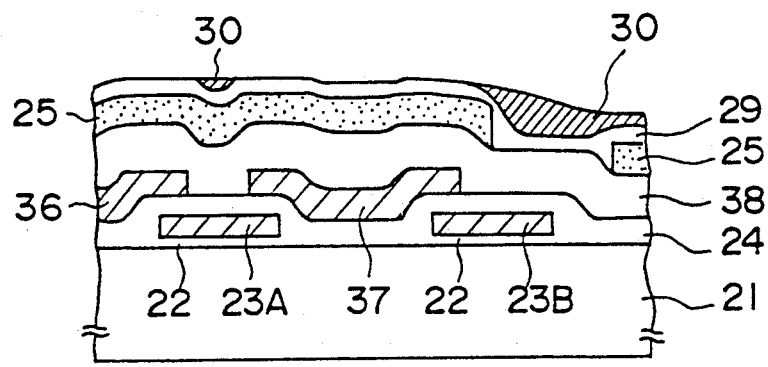

In a step of FIG. 6E, the SOG layer 30 is spin-coated on the entire surface of the structure of FIG. 6D, and whereby the planarization of the device surface is achieved. As the region where the contact hole is to be provided has an increased height because of the provision of the polysilicon region 37, the surface of the silicon oxide layer 29 is substantially exposed at a level substantially flush to the planarized surface of the SOG layer 30. After applying an annealing process, the SOG layer 30 is solidified and the entire surface is slightly etched so as to make sure that no SOG layer 30 remains on the region where the contact hole is to be provided.

Figure 6F:
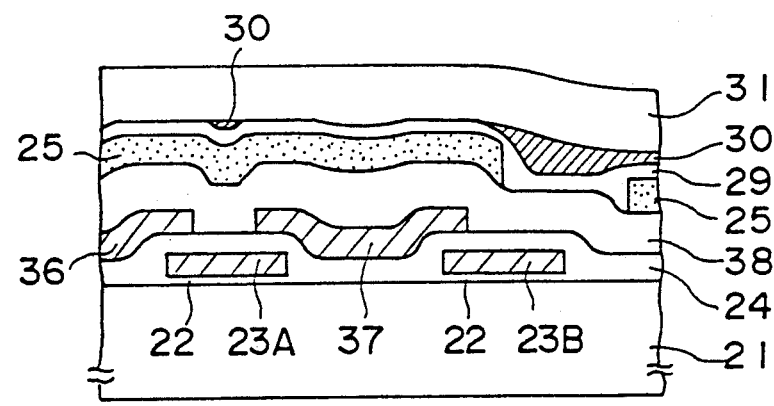
Figure 6G:
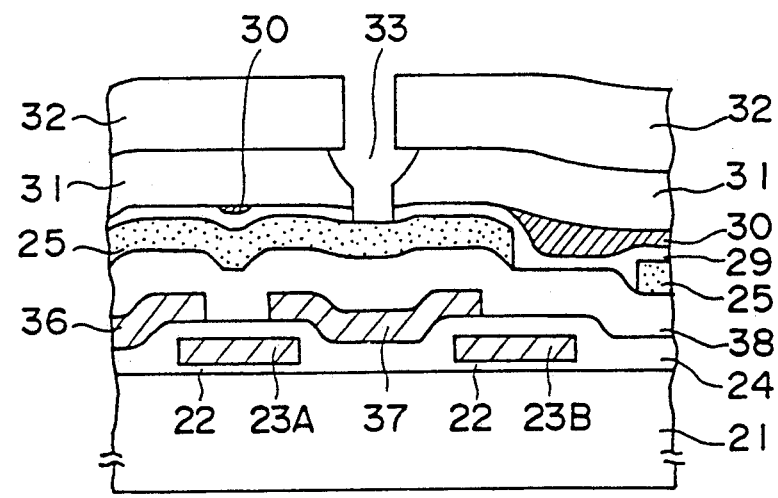

Next, in a step of FIG. 6F, the PSG layer 31 is provided, and in a step of FIG. 6G, the contact hole 33 is provided through the PSG layer 31 and further through the silicon oxide layer 29 in correspondence to the region where the polysilicon region 37 is embedded by using the patterned photoresist 32, until the surface of the first conductor layer 25 is exposed. It should be noted that no SOG layer 30 is exposed at the side wall of the contact hole 33 because of the absence of the SOG layer 30 in this region.

Figure 6H:
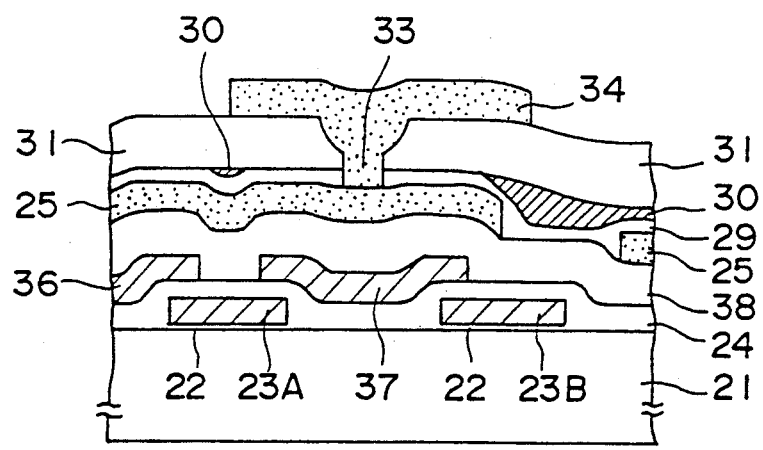

Further, in a step of FIG. 6H, the photoresist 32 is removed and the second layer conductor pattern 34 is provided in correspondence to the contact hole 33 such that the second layer conductor pattern 34 fills the contact hole 33 and makes a contact to the exposed first conductor layer 25. As the second layer conductor pattern 34 does not make a contact to the SOG layer at all in the contact hole 33, the problem of excessive growth of aluminum grains in the contact hole and resultant deterioration of the reliability of electric contact between the first layer conductor pattern 25 and the second layer conductor pattern 34, is completely eliminated.

As described with reference to the first through third embodiments, the present invention provides elimination of the SOG layer from the region of the contact hole by increasing the level of the region where the contact hole is to be formed. Such an increase of the level is achieved by providing an isolated or island-like region such as the oxide region 3s formed simultaneously to the formation of the field oxide structure, or the silicon oxide region 27 formed on the first layer conductor pattern 25, or the polysilicon region 37 formed simultaneously to the formation of the resistances and other first layer interconnections, in correspondence to the region where the contact hole is to be provided. Further, by applying an etching process after formation and solidification of the SOG layer, the elimination of the SOG layer from the region of the contact hole can be made perfect.

By constructing the semiconductor device as such, the problem of unreliable contact of the second layer conductor pattern, conventionally caused by the release of gases from the SOG layer upon deposition of the second layer conductor pattern on the contact hole which exposes the SOG layer at the side wall, is eliminated and a reliable inter-layer interconnection is achieved. AS a result, failure of the contact is eliminated and the reliability and operational characteristic of the semiconductor device is improved.

It should be noted that the isolated region used for increasing the level of the device surface in correspondence to where the contact hole is to be provided, is not limited to the foregoing silicon oxide or polysilicon, but other materials such as sputtered silicon oxide layer, silicon nitride layer, silicon oxynitride layer may also be used. Further, various polycide structures wherein various silicides such as tungsten silicide ($WSi_2$), molybdenum silicide ($MoSi_2$), titanium silicide ($TiSi_2$) are provided on the polysilicon layer can also be used for this purpose.

The first and second layer conductor patterns used in the device of the present invention is not limited to pure aluminum or aluminum alloy containing silicon as disclosed, but other materials such as aluminum alloy containing silicon and copper, aluminum-copper alloy, copper, or other refractory metals may also be employed.

Further, the present invention is not only applicable to the MOS integrated circuits having the MOS devices as the active devices as disclosed, but can be applicable to any other integrated circuits wherein the planarization is achieved using the SOG layer for multi-level interconnection.

Further, the present invention is not limited to the embodiments described heretofore but various variations and modifications may be made without departing from the scope of the invention.

What is claimed is:

1. A semiconductor device having a multi-level interconnection structure, comprising:
   one or more active devices;
   a substrate for supporting the active devices thereon;
   an isolated region provided on the substrate, said isolated region projected from the substrate;
   a first insulator layer provided on the substrate and isolated region to cover the active devices and the isolated region, said isolated region causing a projection of the first insulator layer at a part covering the isolated region;

a first conductor pattern provided on the first insulator layer;

a cover layer having a top surface and formed on the first insulator layer and the first conductor pattern to bury the first insulator layer and the first conductor pattern underneath, said cover layer having a projected part in correspondence to the isolated region;

a planarizing layer having a planarized top surface provided on the cover layer to bury the cover layer underneath, said planarizing layer formed such that a part of the top surface of the cover layer, corresponding to the projected part, is exposed by projecting to a level flush to or above the planarized top surface of the planarizing layer;

a second insulator layer provided on the planarizing layer to cover the planarized top surface of the planarizing layer and the exposed part of the top surface of the cover layer;

a contact hole provided on the second insulator layer in correspondence to said isolated region to penetrate through the second insulation layer and the cover layer to expose a desired part of the first conductor pattern while not exposing the planarizing layer; and a second conductor pattern provided on the second insulator layer in correspondence to the contact hole to fill the contact hole and to make a contact to the exposed part of the first conductor pattern.

2. A semiconductor device as claimed in claim 1 in which said isolated region comprises an oxide layer provided on the substrate.

3. A semiconductor device as claimed in claim 1 in which said planarizing layer comprises a spin-on-glass layer.

4. A semiconductor device as claimed in claim 1 in which said isolated region comprises a region of polysilicon provided below the first insulator layer and above the active devices.

5. A semiconductor device as claimed in claim 4 in which in that said isolated region is provided in correspondence to a depression formed between the active devices.

6. A semiconductor device having a multi-level interconnection structure, comprising:

one or more active devices;

a substrate for supporting the active devices thereon;

a first insulator layer provided to cover the substrate including the active devices;

a first conductor pattern provided on the first insulator layer;

an isolated region having a top surface and provided on said first conductor pattern;

a planarizing layer having a planarized top surface provided on the first insulator layer to bury the first conductor pattern underneath, said isolated region having a top surface at a level substantially flush with the planarized top surface of the planarizing layer;

a second insulator layer provided on the planarized top surface of the planarizing layer including the top surface of the isolated region;

a contact hole provided on the second insulator layer to expose a desired part of the first conductor pattern in correspondence to the isolated region such that said isolated region is penetrated by contact hole; and a second conductor pattern provided on the second insulator layer in correspondence to the contact hole to fill the contact hole and to make a contact to the exposed part of the first conductor pattern.

7. A semiconductor device as claimed in claim 6 in which said isolated region is provided on a depressed part of the first insulator layer between the active devices.

* * * * *